United States Patent
Joshi et al.

(10) Patent No.: US 7,446,023 B2
(45) Date of Patent: Nov. 4, 2008

(54) HIGH-DENSITY PLASMA HYDROGENATION

(75) Inventors: Pooran Chandra Joshi, Vancouver, WA (US); Apostolos T. Voutsas, Vancouver, WA (US); John W. Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 301 days.

(21) Appl. No.: 11/013,605

(22) Filed: Dec. 15, 2004

(65) Prior Publication Data

US 2005/0202652 A1    Sep. 15, 2005

Related U.S. Application Data

(63) Continuation-in-part of application No. 10/871,939, filed on Jun. 17, 2004, now Pat. No. 7,186,663, and a continuation-in-part of application No. 10/801,374, filed on Mar. 15, 2004, now Pat. No. 7,087,537.

(51) Int. Cl.
*H01L 21/332* (2006.01)

(52) U.S. Cl. ............... 438/475; 438/771; 438/798; 257/66; 257/532

(58) Field of Classification Search ............. 438/475, 438/771, 798; 257/66, 532
See application file for complete search history.

(56) References Cited

U.S. PATENT DOCUMENTS

| | | | |
|---|---|---|---|
| 4,735,917 A * | 4/1988 | Flatley et al. ............ 438/164 |
| 5,250,444 A | 10/1993 | Khan et al. ............ 438/162 |
| 5,711,998 A | 1/1998 | Shufflebotham ........ 427/535 |
| 5,883,016 A | 3/1999 | Chan et al. ............ 438/798 |
| 6,228,751 B1 * | 5/2001 | Yamazaki et al. ...... 438/585 |
| 6,297,103 B1 * | 10/2001 | Ahn et al. ............ 438/275 |
| 6,281,053 B1 | 8/2002 | Yuda ................... 438/149 |
| 7,145,210 B2 * | 12/2006 | Noda et al. ............ 257/408 |
| 2002/0094643 A1 | 7/2002 | Solomon et al. ........ 438/279 |

* cited by examiner

*Primary Examiner*—Carl Whitehead, Jr.
*Assistant Examiner*—Colleen E Rodgers
(74) *Attorney, Agent, or Firm*—Law Office of Gerald Maliszewski; Gerald Maliszewski

(57) ABSTRACT

A high-density plasma hydrogenation method is provided. Generally, the method comprises: forming a silicon (Si)/oxide stack layer; plasma oxidizing the Si/oxide stack at a temperature of less than 400° C., using a high density plasma source, such as an inductively coupled plasma (ICP) source; introducing an atmosphere including H2 at a system pressure up to 500 milliTorr; hydrogenating the stack at a temperature of less than 400 degrees C., using the high density plasma source; and forming an electrode overlying the oxide. The electrode may be formed either before or after the hydrogenation. The Si/oxide stack may be formed in a number of ways. In one aspect, a Si layer is formed, and the silicon layer is plasma oxidized at a temperature of less than 400 degrees C., using an ICP source. The oxide formation, additional oxidation, and hydrogenation steps can be conducted in-situ in a common chamber.

20 Claims, 4 Drawing Sheets

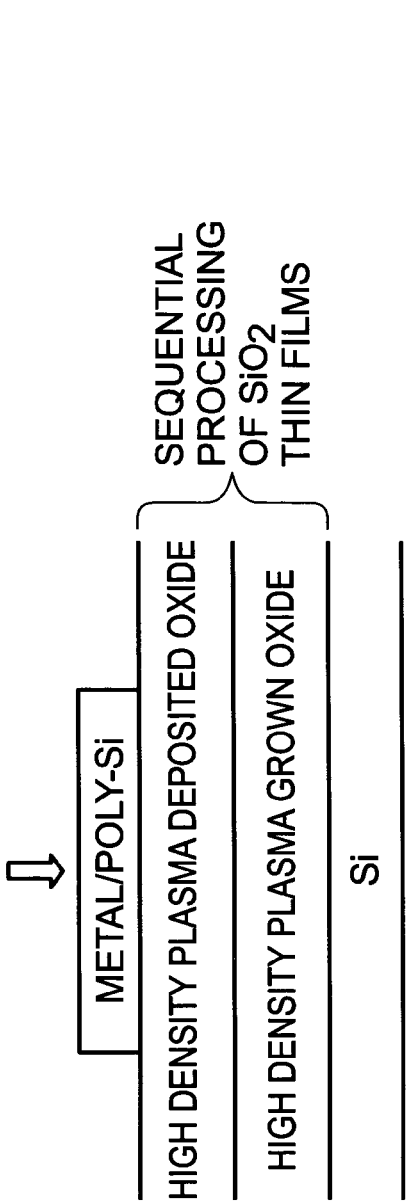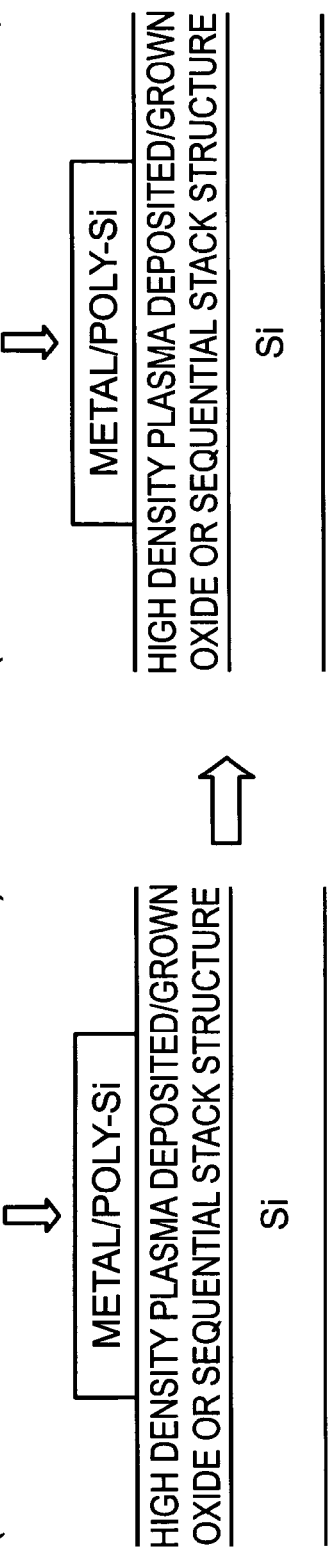

HIGH-DENSITY PLASMA HYDROGENATION

RELATED APPLICATIONS

This application is a continuation-in-part of a patent application entitled, PLASMA PROCESS FOR SILICON THIN FILMS, invented by Pooran Joshi, et al., Ser. No. 10/871,939, filed Jun. 17, 2004 now U.S. Pat. No. 7,186,663.

This application is a continuation-in-part of a patent application entitled, METHODS FOR FABRICATING OXIDE THIN FILMS, invented by Pooran Joshi et al., Ser. No. 10/801,374, filed Mar. 15, 2004 now U.S. Pat. No. 7,087,537. These applications, and their parent applications, are incorporated herein by reference.

BACKGROUND OF THE INVENTION

1. Field of the Invention

This invention generally relates to the fabrication of integrated circuit (IC) devices, and more particularly, to a hydrogenated oxide interface on silicon and a method for forming the same using high-density hydrogen plasma.

2. Description of the Related Art

The quality of polysilicon thin films and the interface between silicon and silicon dioxide ($Si/SiO_2$) layers are critical to the performance of thin film transistor, MOS capacitors, and various ICs. A hydrogenation process is generally carried out to passivate the dangling bonds in polysilicon layers, and in the interface between the polysilicon and gate insulator (silicon oxide) films. Conventional hydrogenation approaches introduce hydrogen at the grain boundaries and $Si/SiO_2$ interfaces using either a forming gas anneal (FGA), or a plasma hydrogen treatment. The diffusion of hydrogen through a device is dependent upon the device structure, physical and chemical characteristics of the constituent layers, and the thermal state. The forming gas anneal process typically involves heating the device in an atmosphere of molecular hydrogen (4-10%) and nitrogen gas. The FGA process is highly inefficient for the low temperature devices due to very low rate diffusion kinetics. As a result, the FGA is typically carried out at temperatures exceeding 300° C. The FGA thermal budget strongly depends on the temperature, and is significantly higher than a plasma-based process. The forming gas anneal process typically requires a high thermal budget to properly enhance polysilicon and $Si/SiO_2$ interface characteristics. Due to the high thermal budget, the forming gas annealing process is not efficient for high throughput commercial applications.

The plasma hydrogen processes are much more efficient than FGA for the introduction of hydrogen at the polysilicon grain boundaries and $Si/SiO_2$ interface. A stable and reliable $Si/SiO_2$ interface is critical for the fabrication of advanced display devices and other integrated circuits. The quality of the $SiO_2/Si$ interface is dictated by the quality of the $SiO_x$ transition layer at the interface and the defects in the poly-Si layer. The general approach is to improve the quality of the $SiO_x$ transition layer at the $Si/SiO_2$ interface. Defects in the poly-Si can also be passivated and the stoichiometry improved by oxidation and hydrogenation processes. A hydrogen plasma is generated between coupled electrodes. However, the limitations associated with coupled electrodes prevent the generation of an especially reactive hydrogen species. A high throughput commercial plasma hydrogenation fabrication requires further decreases in the temperature and thermal budgets to process low temperature, large area, integrated circuits and liquid crystal displays (LCDs).

Although lower temperatures are generally desirable for any device fabrication process, they are especially critical in LCD manufacture, where large-scale devices are formed on a transparent glass, quartz, or plastic substrate. These transparent substrates can be damaged when exposed to temperatures exceeding 650 degrees C. To address this temperature issue, low-temperature Si oxidation processes have been developed. These processes use a high-density plasma source such as an inductively coupled plasma (ICP) source, and are able to form Si oxide with a quality comparable to 1200 degree C. thermal oxidation methods.

It would be advantageous if a process could be developed to enhance the hydrogenation of polysilicon film and $Si/SiO_2$ interfaces at a significantly lower thermal budget and temperature, as compared to the above-mentioned conventional hydrogenation processes.

It would be advantageous if low-temperature plasma processes could be developed for hydrogenation, comparable to the high-density plasma oxidation processes.

It would be advantageous if the low-temperature plasma oxide and hydrogenation processes could be carrier out in-situ, as a continuous process.

SUMMARY OF THE INVENTION

The present invention describes the hydrogenation of polysilicon films and $Si/SiO_2$ interfaces, at a significantly lower thermal budget, using a high-density hydrogen plasma treatment. As compared to conventional processes, the efficiency of the present invention hydrogenation process is as a result of enhancing the concentration and state of active hydrogen species. The high plasma density and energy of the high-density plasma process makes it possible to generate active hydrogen species, to achieve the efficient hydrogenation of polysilicon layers and $Si/SiO_2$ interfaces at a lower temperature and thermal budget than conventional FGA and plasma processes. The present invention hydrogenation process can be carried out at temperatures of less than 400° C., making it suitable for the low temperature integration of devices on glass or other temperature-sensitive substrates.

Accordingly, a high-density plasma hydrogenation method is provided. Generally, the method comprises: forming a silicon (Si)/oxide stack layer; plasma oxidizing the Si/oxide stack at a temperature of less than 400° C., using a high-density plasma source, such as an inductively coupled plasma (ICP) source; introducing an atmosphere including H2 at a system pressure up to 500 milliTorr (mTorr); hydrogenating the Si/oxide stack at a temperature of less than 400 degrees C., using the high density plasma source (i.e., the ICP); and forming an electrode overlying the oxide. The electrode may be formed either before or after the hydrogenation.

The Si/oxide stack may be formed in a number of ways. In one aspect, a Si layer is formed, and the silicon layer is plasma oxidized at a temperature of less than 400 degrees C., using an ICP source, forming a first oxide layer. Then, a second oxide layer is deposited overlying the first oxide layer at a temperature of less than 400 degrees C., using a high density plasma-enhances chemical vapor deposition process (HD-PECVD) process, forming an oxide bilayer. Alternately, just the first oxide layer is formed. In another variation, a single oxide layer is formed through the HD-PECVD process.

Additional details of the above-described method and devices with hydrogenated oxide interfaces are presented in detail below.

BRIEF DESCRIPTION OF THE DRAWINGS

FIG. 5 is a partial cross-sectional view of a sequential stack structure hydrogenated using the high-density hydrogen plasma process.

FIG. 6 is a partial cross-sectional view of HD oxide and hydrogen plasma treatments carried out at a temperature of less than 200 degrees C.

DETAILED DESCRIPTION

Figure 1:
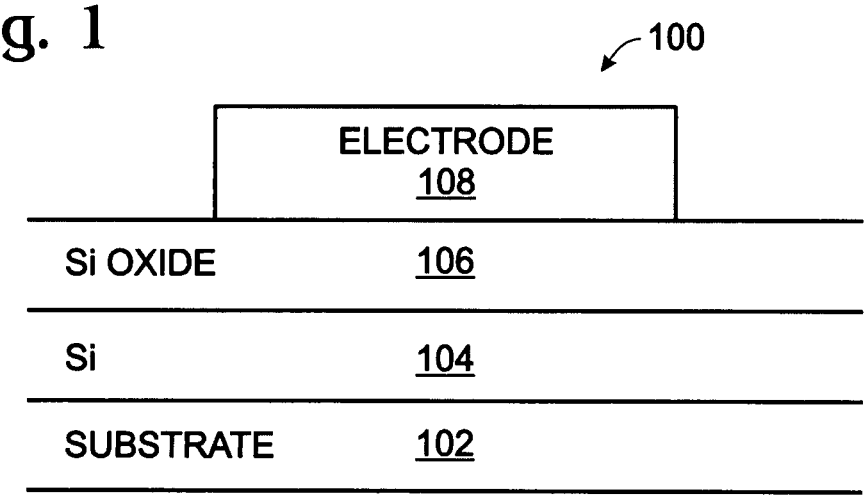
FIG. 1 is a partial cross-sectional view of a capacitor device with a hydrogenated oxide interface.

FIG. 1 is a partial cross-sectional view of a capacitor device with a hydrogenated oxide interface. The device 100 comprises a transparent substrate 102, sensitive to process temperatures of greater than 600 degrees C. For example, the transparent substrate 102 can be glass, quartz, or plastic. A silicon (Si) film 104 overlies the transparent substrate 102. Note, is some aspects a diffusion barrier (not shown) of a material such as $SiO_2$ or $SiO_xN_y$, may separate the Si film 104 and transparent substrate 102. An oxide layer 106 overlies the Si film 104, and a conductive electrode 108 overlies the oxide layer 106. The oxide layer 106 has an interface trap concentration (Dit) of less than $5 \times 10^{10}$ $eV^{-1}cm^{-2}$, a leakage current density of less than $1 \times 10^{-8}$ $A/cm^2$ (at 2 MV/cm), and a breakdown field of greater than 8 MV/cm.

Figure 2:
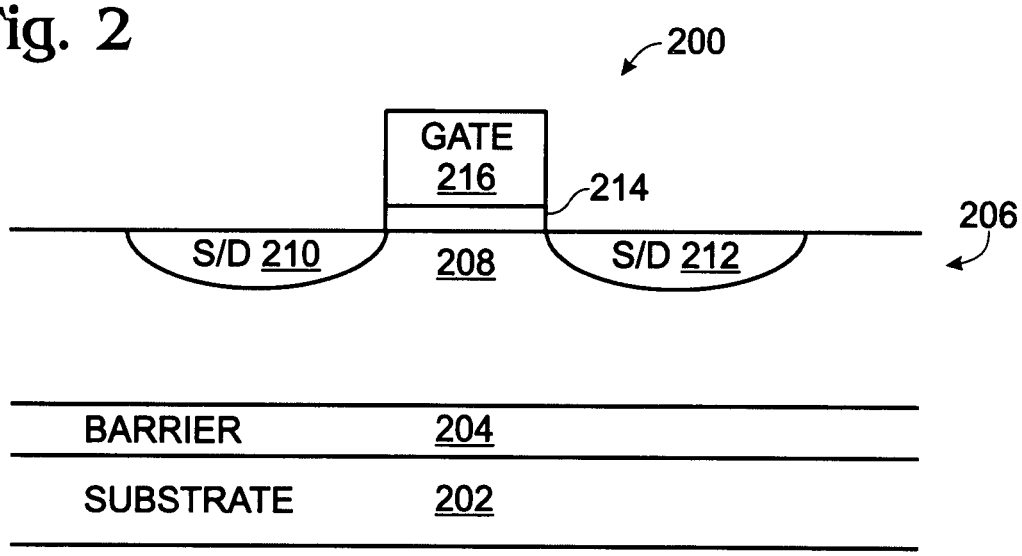
FIG. 2 is a partial cross-sectional view of a liquid crystal display (LCD) thin-film transistor (TFT).

FIG. 2 is a partial cross-sectional view of a liquid crystal display (LCD) thin-film transistor (TFT). The TFT 200 comprises a temperature sensitive transparent substrate 202, such as glass, plastic or polymer, or quartz. A diffusion barrier 204 overlies the transparent substrate 202. An active silicon layer 206, including a channel region 208 and source/drain (S/D) regions 210 and 212, overlies the diffusion barrier 204. Note, a Si substrate (not shown) may separate the diffusion barrier 204 from the active Si layer 206. A gate oxide layer 214 overlies the channel region 208, and a gate electrode 216 overlies the gate oxide layer 214. The oxide layer 214 has an interface trap concentration (Dit) of less than $5 \times 10^{10}$ $eV^{-1}cm^{-2}$, a leakage current density of less than $1 \times 10^{-8}$ $A/cm^2$ (at 2 MV/cm), and a breakdown field of greater than 8 MV/cm.

Figure 3:
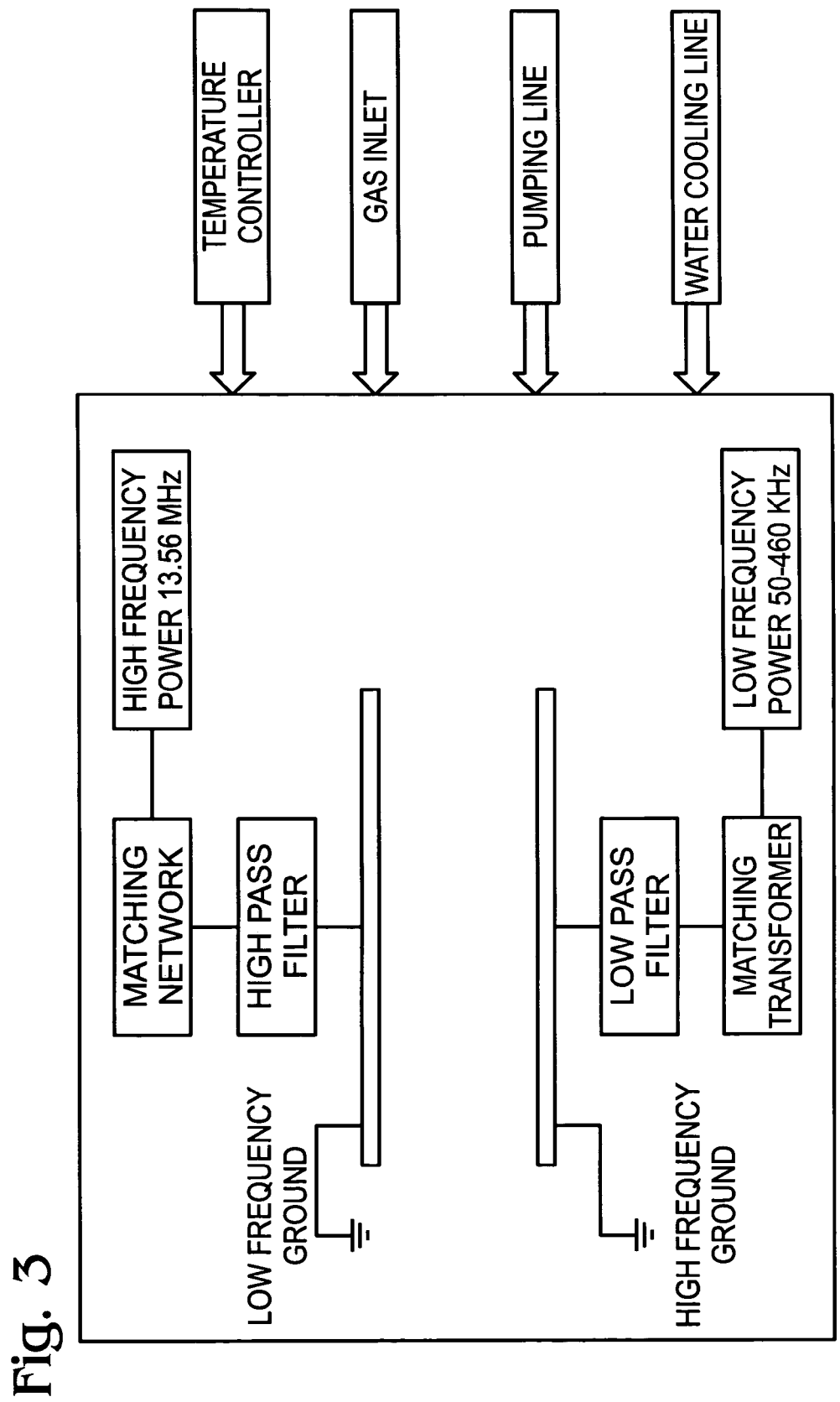
FIG. 3 is a schematic block drawing of a high-density plasma hydrogenation system.

FIG. 3 is a schematic block drawing of a high-density plasma hydrogenation system. The higher plasma density and energy levels associated with the process permit it to hydrogenate with at lower temperatures than the conventional plasma hydrogenation process. In some aspects, the hydrogenation process uses a transmission/transformer coupled plasma (TCP) source (not shown). The TCP source allows the process to be scaled up for larger applications, such as the commercial fabrication of LCDs. Generally, the present invention process can be modified for use with any high-density hydrogen plasma source.

In conventional plasma chambers, the two electrodes are coupled, and it is not possible to independently control energy directed to the top and bottom electrodes. Therefore, any attempt to enhance the growth rate by increasing the high frequency power, leads to an increase in the sheath potential, which adversely affects the bulk and interface quality of thin films.

As shown, the top electrode is decoupled from the bottom electrode, permitting different power levels and frequencies to be used simultaneously by the two electrodes. In one configuration as shown, the top electrode is driven by a high frequency radio frequency (RF) source, while the bottom electrode is driven by a low frequency power source. The RF power is coupled to the top electrode through a high-density inductively coupled plasma source through a matching network. The bottom electrode power can be varied independently of the top electrode. The top electrode frequency can be in the range of 13.56 to 300 megahertz (MHz). The bottom electrode power can be varied in the range of 50 kilohertz (KHz) to 13.56 MHz, to control the hydrogenation process. The pressure can be varied up to 500 mTorr. The top electrode can deliver power as high as 10 watts per square centimeter ($W/cm^2$), while the bottom electrode power can be as high as 3 $W/cm^2$. Further, the system of FIG. 3 can be used to plasma oxide Si, deposit oxide, or plasma oxidize a previously formed oxide layer. As a result, plasma oxide deposition and oxidation processes can be carrier out in-situ with the hydrogenation process, by merely changing the chamber atmosphere.

Functional Description

To illustrate the advantages of the invention, the effects of the forming gas anneal process were compared to the high-density plasma hydrogenation of MOS capacitors and thin film transistors (TFTs). These devices were investigated to analyze and establish the influence of the high-density, low thermal budget hydrogen plasma on the interface characteristics. The various device configurations and the enhancement in the properties resulting from the high-density hydrogen plasma treatment, and a comparison with a higher thermal budget forming gas anneal treatment, are summarized below.

Figure 4:
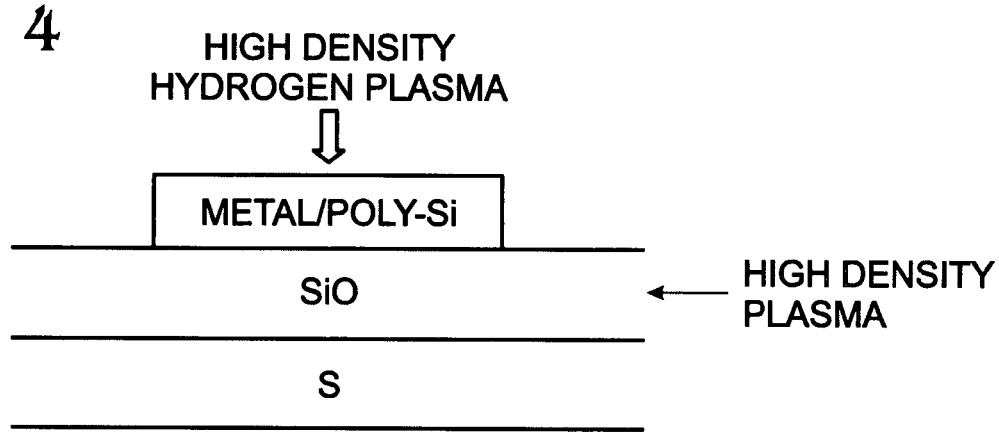
FIG. 4 is a partial cross-sectional view of a MOS capacitor, hydrogenated using the high-density plasma process.

FIG. 4 is a partial cross-sectional view of a MOS capacitor, hydrogenated using the high-density plasma process. MOS capacitor characteristics and reliability are dictated by the $Si/SiO_2$ interface properties. The properties of MOS capacitors, hydrogenated using FGA and high-density hydrogen plasma, are compared in Table I. The forming gas anneal was carried out at a temperature of 450° C. for 30 minutes, while the high-density hydrogen plasma treatment was carried out at 350° C. for 15 minutes. The leakage current density and the interface trap concentration associated with the high-density hydrogen plasma treatment show a significant improvement over the FGA method, even when performed at a significantly lower thermal budget.

TABLE I

Properties of the MOS capacitor after FGA and high-density plasma based hydrogenation treatment.

| | d (Å) | $D_{it}$ ($\times 10^{10}$ $eV^{-1}cm^{-2}$) | J ($A/cm^2$) (at 2 MV/cm) | $E_{BD}$ (MV/cm) (Physical) |
|---|---|---|---|---|
| Forming Gas Anneal (450° C./30 min) | 300 | 2.9 | 2.6E–08 | 10.6 |
| High-density H-Plasma (350° C./15 min) | 300 | 1.2 | 5.1E–09 | 11.2 |

FIG. 5 is a partial cross-sectional view of a sequential stack structure hydrogenated using the high-density hydrogen plasma process. High-density silicon oxide plasma growth and deposition processes, in combination with the HD hydrogen plasma methods, make it possible to fabricate capacitors with enhanced interfacial and bulk properties. A typical scheme for the sequential processing of gate dielectric layers is shown in FIG. 5. The plasma growth makes it possible to grow thermal quality interfacial oxide at temperatures lower than 400° C.; temperature at which thermal growth rates are impractical. The high-density PECVD process makes it possible to deposit a high quality oxide at low temperatures, on top of the interfacial oxides, at rates suitable for high throughput applications. The interfacial characteristics of the MOS structure can be further enhanced by pre- or post-metal high-density hydrogen plasma treatment at thermal budgets significantly lower than the conventional forming gas anneal. At the same time, the HD hydrogen plasma passivation is much more efficient, in that it generates more active hydrogen species (atoms, molecules, radicals), as compared to FGA which is carried out in molecular hydrogen atmosphere ($N_2/H_2$ (4-10%)). The improvements in the interface trap concentration and the leakage current density are listed in Table II. Both the parameters show significant improvement after the low thermal budget high-density hydrogen plasma treatment, as compared to forming gas anneal.

TABLE II

The properties of the MOS capacitors with stacked gate dielectric after the forming gas anneal (450° C./30 min) and high-density H-plasma treatment (350° C./15 min).

|  | d (Å) | $D_{it}$ ($\times 10^{10}$ eV$^{-1}$cm$^{-2}$) | J (A/cm$^2$) (at 2 MV/cm) |
|---|---|---|---|
| Stack (FGA) | 200 | 8.5 | 1.5E–08 |
| Stack (H-Plasma) | 200 | 2.2 | 1.2E–09 |

FIG. 6 is a partial cross-sectional view of HD oxide and hydrogen plasma treatments carried out at a temperature of less than 200 degrees C. The high-density plasma processes makes it possible to deposit high quality oxide at temperatures lower than 200° C., which are suitable for integration on low temperature substrates such as polymer. The properties of the high-density PECVD oxide deposited at temperatures lower than 200° C. are further improved by subsequently performing a high-density plasma oxidation process, also carried out at temperatures lower than 200° C. The bulk and interfacial characteristics of the oxide thin films can be improved by further subjecting the samples to a high-density hydrogen plasma process at temperatures lower than 200° C. A typical low temperature sequence to fabricate the MOS capacitors is shown in FIG. 6. The typical effects of the post-deposition high-density oxygen/inert gas plasma and hydrogen plasma on the electrical properties are listed in Table III. The high-density plasma oxygen/inert gas plasma provides active oxygen species, which improve the interfacial and bulk properties of the low temperature oxide. The properties are further enhanced by the high-density hydrogen plasma treatment. The observed improvement in the bulk and interfacial characteristics clearly indicates that the high-density plasma based processes are effective in providing active oxygen and hydrogen species that can diffuse, even into thicker oxide layers, at low thermal budgets.

TABLE III

The effects of the high-density plasma oxidation and hydrogenation processes on the low temperature deposited gate oxide thin films. The deposition, oxidation, and hydrogenation were all carried out at a temperature of 150° C.

| Temp (° C.) | Condition | d (Å) | $V_{FB}$ (V) | $D_{it}$ ($\times 10^{10}$ eV$^{-1}$cm$^{-2}$) | J (A/cm$^2$) at 2 MV/cm |
|---|---|---|---|---|---|
| 150 | As-Deposited He/O$_2$ | 500 | –7.5 | 3.5 | 1.80E–07 |
| 150 | Plasma He/O$_2$ + 30 s | 500 | –0.8 | 1.2 | 2.60E–08 |
| 150 | H-Plasma | 500 | –1.0 | 1.2 | 4.30E–09 |

The next generation of high performance display devices requires TFTs with enhanced electrical characteristics, made at lower processing temperatures. TFTs show significant improvements in the electrical performance after a high-density hydrogen plasma treatment, at a temperature of 350° C. for 10 minutes. The transfer and the gate characteristics of the TFTs exhibit major improvements, with a narrower data distribution necessary for the fabrication of high performance, stable, and reliable devices.

As demonstrated above, the characteristics of silicon oxide interfaces can be improved using HD plasma oxidation and plasma deposition techniques. These processes are detailed in the parent applications from which this application depends, and those details are incorporated herein by references. A summary of some of those details follows.

The methods combine the use of a high-density inductively coupled plasma (HD-ICP) growth and a high-density plasma enhanced chemical vapor deposition (HD-PECVD) process, both operating at substrate temperatures below 400° C. The method produces high quality oxide layers at growth rates significantly higher than those for conventional thermal oxides. The present invention method is an in-situ process forming gate oxide layers for TFTs and other IC applications. Processing below 400° C. (low temperature) permits the possibility of integration on transparent substrates such as glass and polymer. The plasma oxide formation method uses a system similar to the one shown in FIG. 3. As noted earlier, the system permits the electrodes to be decoupled, resulting in low self-bias at the substrate. Thus, the system configuration permits independent control of plasma ion/electron density and energy to enhance both film growth rate and bulk and interface properties. These high-density plasma processes are effective in the efficient generation of oxygen radicals to effectively improve the oxidation state of an oxide film and enhance its electrical performance.

The high-density plasma oxidation system is the same as the one shown in FIG. 3. The top electrode is driven by a high frequency RF source, while the bottom electrode is driven by a low frequency power source. The RF power is coupled to the top electrode through a high-density inductively coupled plasma source through a matching network. The bottom electrode power can be varied independently of the top electrode. The top electrode power can be in the range of 13.56-300 MHz depending on the ICP design. The bottom electrode power can be varied in the range of 50 KHz-13.56 MHz to control the oxidation process. The pressure can be varied up to 500 mTorr. The top electrode power can be increased up to 10 W/cm$^2$, while the bottom electrode power can be increased up to 3 W/cm$^2$.

Thermal oxidation produces an oxide with good bulk and interface characteristics. However, thermal $SiO_2$ growth rates are impractical at temperatures below 800° C. The high-density plasma oxidation of silicon has shown growth rates significantly higher than those for thermal oxidation. In addition, plasma oxide maintains good characteristics in thin layers (less than 20 nm).

The HD plasma oxidation processes are effective in minimizing impurities incorporated in the films during deposition at low processing temperatures, as well as impurity-related bonds in the films. This is possible because plasma density and energy levels are higher for the HD-PECVD process than those for conventional PECVD processes.

The invention also combines plasma oxide and HD-PECVD oxide into an oxide bilayer as shown in FIG. 5. One application for the oxide bilayer is a low temperature high quality gate oxide stack for TFT devices. The interface and bulk properties of the gate oxide layer can be significantly enhanced by fabricating stacked structures using a combination of plasma oxidation and HD-PECVD techniques. The plasma oxidation of silicon at temperatures below 400° C. using the HD-ICP source makes it possible to enhance the gate interface characteristics while exploiting the high deposition rate of the HD-PECVD process. That is, the invention takes advantage of the properties associated with plasma oxide and HD-PECVD oxide by first forming a thin plasma oxide layer and then depositing a (generally) thicker HD-PECVD oxide layer. Since the oxidation rate for plasma oxide is relatively low, it is preferable to minimize the thickness of the plasma oxide as necessary to obtain the desirable interface properties. This is typically less than 20 nm. HD-PECVD oxide, with its higher growth rate, is then deposited over the plasma oxide layer. The gate stacked structures fabricated in-situ by using a combination of the plasma oxidation and HD-PECVD processes at substrate temperatures below 400° C. provide significant enhancement in gate oxide quality, compared to those processed by conventional PECVD processes currently being used for TFT and other IC applications. These gate-stacked structures also can solve major issues related to integration on low temperature substrates, interface quality, and reliability of gate structures. In addition, for IC device manufacturing, the present invention can significantly reduce the thermal budget and increase device throughput.

Figure 7:
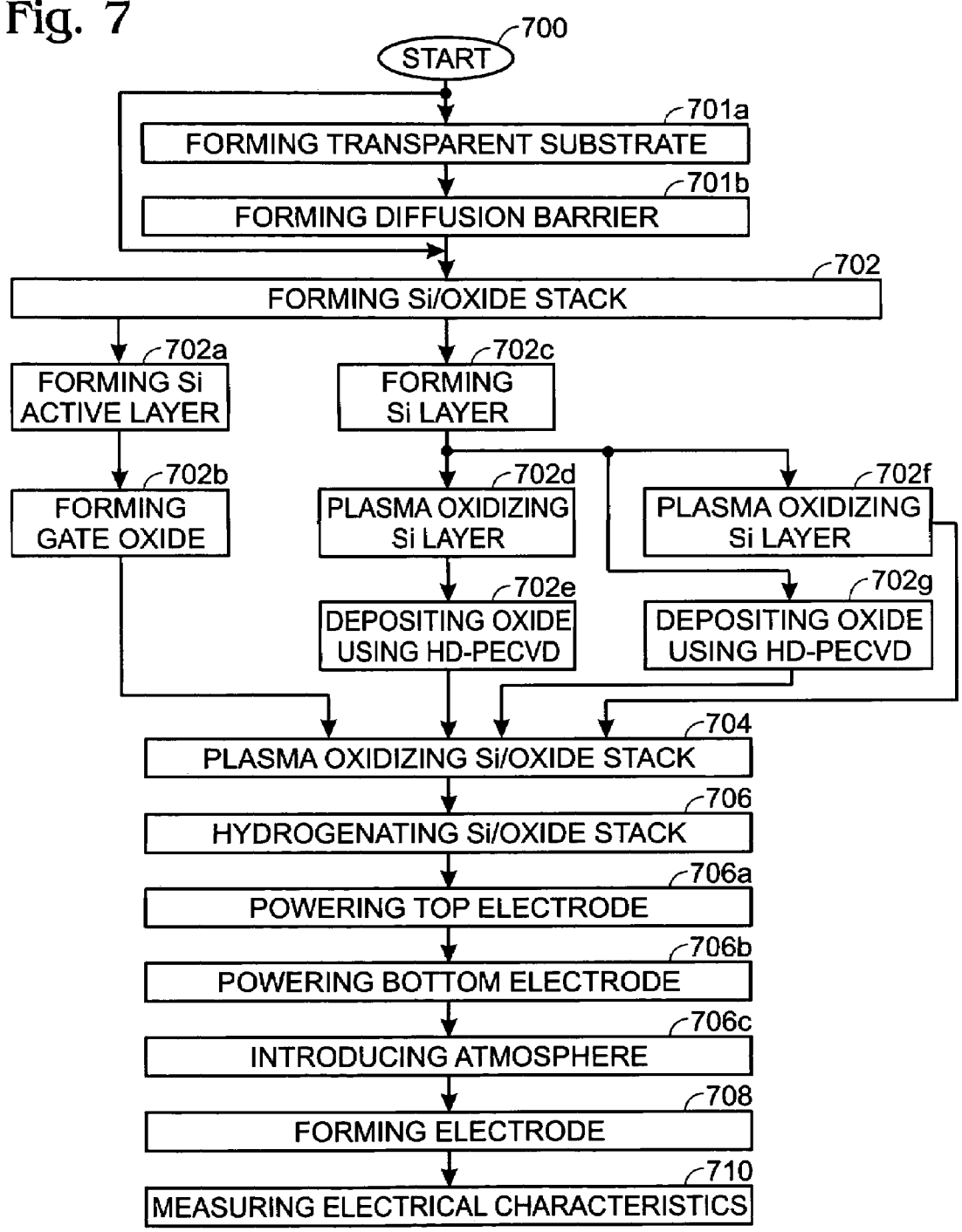
FIG. 7 is a flowchart illustrating a high-density plasma hydrogenation method.

FIG. 7 is a flowchart illustrating a high-density plasma hydrogenation method. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700.

Step 702 forms a silicon (Si)/oxide stack layer. The Si layer can be amorphous silicon, microcrystalline silicon, or polycrystalline silicon. Step 704 plasma oxidizes the Si/oxide stack at a temperature of less than 400° C., using a high-density plasma source. For example, an inductively coupled plasma (ICP) source may be used. Step 706 hydrogenates the Si/oxide stack at a temperature of less than 400 degrees C., using the high-density plasma source. Step 708 forms an electrode overlying the oxide. In one aspect, the electrode is formed subsequent to hydrogenation. Alternately, the electrode is formed prior to hydrogenation. That is, Step 708 occurs before Step 706. For example, the electrode overlying the oxide may form a capacitor.

In one aspect, plasma oxidizing the Si/oxide stack using a high-density plasma source in Step 704 includes oxidizing the Si/oxide stack in a process chamber (see FIG. 3). Hydrogenating the Si/oxide stack using the high-density plasma source in Step 706 includes hydrogenating the Si/oxide stack in the chamber, in-situ as a process continuous with the Si/oxide stack plasma oxidation process.

In another aspect, hydrogenating the Si/oxide using the high-density plasma source in Step 706 includes using an ICP source (see FIG. 3). However, it should be understood that the method is applicable to any system that generates a high density of hydrogen plasma. Hydrogenating the Si/oxide stack using the ICP source includes substeps. Step 706a supplies power to a top electrode at a frequency in the range of 13.56 to 300 megahertz (MHz), and a power density of up to 10 watts per square centimeter ($W/cm^2$). Step 706b supplies power to a bottom electrode at a frequency in the range of 50 kilohertz to 13.56 MHz, and a power density of up to 3 $W/cm^2$. Step 706c uses an atmosphere pressure in the range of 1 to 500 mTorr.

In one aspect, hydrogenating the Si/oxide stack in Step 706c includes introducing an atmosphere including H2 at a system pressure up to 500 milliTorr (mTorr). Further, the H2 atmosphere may include insert gases such as N2, He, Ar, or Kr.

In another aspect, Step 701a forms a transparent substrate layer of a temperature sensitive material such as polymer or glass. Step 701b forms a diffusion barrier overlying the substrate layer and underlying the silicon layer. Forming the Si/oxide stack in Step 702 includes substeps. Step 702a forms an active Si layer including a transistor channel, source, and drain regions. Step 702b forms a gate oxide layer overlying the active Si layer. Then, hydrogenating the Si/oxide stack in Step 706 includes hydrogenating the Si active layer and gate oxide layer, and forming the electrode in Step 708 includes forming a gate electrode overlying the gate oxide layer.

In a different aspect, forming the Si/oxide stack in Step 702 includes alternate substeps. Step 702c forms a Si layer by any conventional means. Step 702d plasma oxidizes the silicon layer at a temperature of less than 400 degrees C., using an ICP source, forming a first oxide layer. Step 702e deposits a second oxide layer overlying the first oxide layer at a temperature of less than 400 degrees C., using a high-density plasma-enhances chemical vapor deposition process (HD-PECVD) process, forming an oxide bilayer. For example, the oxide bilayer may have a thickness in the range of 50 to 1000 Å. Then, Step 706 hydrogenates the Si/oxide bilayer stack.

In another variation, forming the Si/oxide stack in Step 702 includes other substeps. Step 702c forms a Si layer. However, Step 702f plasma oxidizing the Si layer at a temperature of less than 400 degrees C. using an ICP source. For example, Step 702f may use the ICP source to form an oxide layer having a thickness of up to 200 Å.

In yet another variation, Step 702c forms a Si layer, and Step 702g deposits an oxide layer overlying the Si layer at a temperature of less than 400 degrees C., using a HD-PECVD process. For example, Step 702g may use the HD-PECVD to form an oxide layer having a thickness of up to 1000 Å. It should be understood that in one aspect of the method, the above-mentioned substeps of Step 702 can be performed in-situ with the plasma oxidation of Step 704, as well as with the plasma hydrogenation of Step 706. That is, Step 702, 704, and 706 are formed in-situ as parts of one continuous process.

In another aspect, hydrogenating the Si/oxide stack at a temperature of less than 400 degrees C., using the high density plasma source in Step 706, includes hydrogenating at a temperature of 350 degrees C., or less, for a time of 30 minutes, or less. Then a further step, Step 710, measures an oxide layer interface trap concentration (Dit) of less than $5 \times 10^{10}$ eV$^{-1}$cm$^{-2}$, a leakage current density of less than $1 \times 10^{-8}$ A/cm$^2$ (at 2 MV/cm), and a breakdown field of greater than 8 MV/cm.

A high-density plasma hydrogenation method and some resulting hydrogenated oxide structures have been presented. Some details of specific materials and fabrication steps have been used to illustrate the invention. However, the invention is not limited to merely these examples. Other variations and embodiments of the invention will occur to those skilled in the art.

We claim:

1. A high-density plasma hydrogenation method, the method comprising:
   forming a silicon (Si)/oxide stack layer;
   following the formation of the Si/oxide stack layer, plasma oxidizing the Si/oxide stack at a temperature of less than 400°C. and a pressure of up to 500 milliTorr, using a high-density plasma source to create oxygen radicals;
   in response to plasma oxidizing, oxygen species are diffused into the oxide to modify oxide interfacial and bulk properties; and,
   hydrogenating the Si/oxide stack at a temperature of less than 400°C., using the high-density plasma source as follows:
      supplying power to a top electrode at a frequency in the range of 13.56 to 300 megahertz (MHz), and a power density of up to 10 watts per square centimeter (W/cm$^2$); and,
      supplying power to a bottom electrode at a frequency in the range of 50 kilohertz to 13.56 MHz, and a power density of up to 3 W/cm$^2$,
   in response to HDP hydrogenating the Si/oxide stack, hydrogen species are diffused into the oxide to modify the oxide interfacial and bulk properties.

2. The method of claim 1 further comprising:
   forming an electrode overlying the oxide.

3. The method of claim 2 wherein forming the electrode includes forming the electrode subsequent to hydrogenation.

4. The method of claim 2 wherein forming the electrode includes forming the electrode prior to hydrogenation.

5. The method of claim 2 further comprising:
   forming a transparent substrate layer;
   forming a diffusion barrier overlying the substrate layer and underlying the silicon layer;
   wherein forming the Si/oxide stack includes:
      forming an active Si layer including a transistor channel, source, and drain regions; and
      forming a gate oxide layer overlying the active Si layer;
   wherein hydrogenating the Si/oxide stack includes hydrogenating the Si active layer and gate oxide layer; and
   wherein forming the electrode includes forming a gate electrode overlying the gate oxide layer.

6. The method of claim 2 wherein forming the electrode overlying the oxide includes forming a capacitor.

7. The method of claim 1 wherein hydrogenating the Si/oxide stack includes introducing an atmosphere including H$_2$ at a system pressure up to 500 milliTorr (mTorr).

8. The method of claim 7 wherein introducing an atmosphere including H2 includes introducing an atmosphere with an inert gas selected from the group including N$_2$, He, Ar, and Kr.

9. The method of claim 1 wherein hydrogenating the Si/oxide using the high-density plasma source includes using an inductively coupled plasma (ICP) source.

10. The method of claim 9 wherein hydrogenating the Si/oxide stack using the ICP source includes using an atmosphere pressure in the range of 1 to 500 mTorr.

11. The method of claim 1 wherein forming the Si/oxide stack includes:
    forming a Si layer;
    plasma oxidizing the silicon layer at a temperature of less than 400°C., using an ICP source, forming a first oxide layer; and
    depositing a second oxide layer overlying the first oxide layer at a temperature of less than 400°C., using a high density plasma-enhanced chemical vapor deposition process (HD-PECVD) process, forming an oxide bilayer; and
    wherein hydrogenating the Si/oxide stack includes hydrogenating the Si/oxide bilayer stack.

12. The method of claim 11 wherein forming an oxide bilayer includes forming an oxide bilayer having a thickness in the range of 50 to 1000 Å.

13. The method of claim 1 wherein plasma oxidizing the Si/oxide stack at a temperature of less than 400°C., using a high-density plasma source, includes using an ICP source.

14. The method of claim 1 wherein forming the Si/oxide stack includes forming a Si layer selected from the group including amorphous silicon, microcrystalline silicon, and polycrystalline silicon.

15. The method of claim 1 wherein forming the Si/oxide stack includes:
    forming a Si layer; and
    plasma oxidizing the Si layer at a temperature of less than 400 degrees C. using an ICP source.

16. The method of claim 15 wherein plasma oxidizing the Si layer using an ICP source includes forming an oxide layer having a thickness of up to 200 Å.

17. The method of claim 1 wherein forming the Si/oxide stack includes:
    forming a Si layer; and
    depositing an oxide layer overlying the Si layer at a temperature of less than 400°C., using a HD-PECVD process.

18. The method of claim 17 wherein depositing an oxide layer using a HD-PECVD process includes forming an oxide layer having a thickness of up to 1000 Å.

19. The method of claim 1 wherein hydrogenating the Si/oxide stack at a temperature of less than 400°C., using the high-density plasma source, includes hydrogenating at a temperature of 350°C., or less, for a time of 30 minutes, or less; and
    the method further comprising:
    measuring an oxide layer interface trap concentration (Dit) of less than $5 \times 10_{10e}$V$^{-1}$cm$^{-2}$, a leakage current density of less than $1 \times 10^8$ A/cm$^2$ (at 2 MV/cm), and a breakdown field of greater than 8 MV/cm.

20. The method of claim 1 wherein plasma oxidizing the Si/oxide stack using a high-density plasma source includes oxidizing the Si/oxide stack in a process chamber; and
    wherein hydrogenating the Si/oxide stack using the high-density plasma source includes hydrogenating the Si/oxide stack in the chamber, in-situ as a process continuous with the Si/oxide stack plasma oxidation process.

* * * * *